United States Patent
Abe et al.

(10) Patent No.: US 7,338,921 B2
(45) Date of Patent: Mar. 4, 2008

(54) MGB2 SUPERCONDUCTOR AND METHOD FOR PREPARATION THEREOF

(75) Inventors: Hideki Abe, Ibaraki (JP); Hideaki Kitazawa, Ibaraki (JP); Akiyuki Matsushita, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 353 days.

(21) Appl. No.: 10/475,811

(22) PCT Filed: Apr. 26, 2002

(86) PCT No.: PCT/JP02/04253

§ 371 (c)(1),
(2), (4) Date: Apr. 29, 2004

(87) PCT Pub. No.: WO03/104147

PCT Pub. Date: Dec. 8, 2003

(65) Prior Publication Data
US 2004/0180792 A1   Sep. 16, 2004

(30) Foreign Application Priority Data
Apr. 26, 2001   (JP) ............................... 2001-129863

(51) Int. Cl.
*C01B 35/04*   (2006.01)
*H01L 39/12*   (2006.01)

(52) U.S. Cl. ............. 505/472; 505/100; 505/150; 505/300; 505/450; 505/510; 505/700; 505/704; 205/51; 205/358; 205/354; 205/314; 252/518.1; 423/289; 428/930; 29/599

(58) Field of Classification Search ........ 505/100, 505/150, 300, 450, 510, 700, 704; 205/51, 205/358, 354, 334; 252/518.1
See application file for complete search history.

(56) References Cited

U.S. PATENT DOCUMENTS

| | | | | |
|---|---|---|---|---|
| 2,384,835 A | * | 9/1945 | Hanawalt et al. | 205/404 |
| 4,358,513 A | * | 11/1982 | Kaun | 429/103 |
| 5,215,631 A | * | 6/1993 | Westfall | 205/351 |
| 6,514,557 B2 | * | 2/2003 | Finnemore et al. | 427/62 |
| 7,090,889 B2 | * | 8/2006 | Liu et al. | 427/62 |
| 2002/0173428 A1 | * | 11/2002 | Thieme et al. | 505/100 |

OTHER PUBLICATIONS

Nagamatsu et al, "Superconductivity at 39K in Magnesium Diboride," Nature, 2001, 410, 63-64.*

Kenji Yoshii et al., Electrical transport properties of bulk $MgB_2$ materials sythesized by the electrolysis on fused mixtures of $MgCl_2$, NaCl, KCl and $MgB_2O_4$, Los Alamos National Laboratory, Preprint Archive, Condensed Matter, 1-5, ArXiv:cond-mat/0204208 CODEN:LNCMFR URL:http//xxx.lanl.gov/pdf/cond-mat/0204208, Apr. 9, 2002, CAplus [online], retrieved on Jul. 16, 2002, Retrieved from: STN (CAS).

(Continued)

*Primary Examiner*—Mark Kopec
*Assistant Examiner*—Kallambella Vijayakumar
(74) *Attorney, Agent, or Firm*—Wenderoth, Lind & Ponack, L.L.P.

(57) ABSTRACT

An electrode is steeped in a solution of Mg and B and a negative voltage is applied to the electrode so as to precipitate superconductive $MgB_2$ on the electrode. Superconductive $MgB_2$ is easily manufactured in various forms and at low costs without any special device.

3 Claims, 1 Drawing Sheet

OTHER PUBLICATIONS

Hideki Abe et al., Electrochemical Synthesis of Superconductive Boride $MgB_2$ from Molten Salts, Los Alamos National Laboratory, Preprint Archive, Condensed Matter, 1-10, ArXiv: cond-mat/0204169 CODEN:LNCMFR URL:http://xxx.lanl.gov/pdf/cond-mat/0204169, Apr. 8, 2002, CAplus [online], retrieved on Jul. 16, 2002, Retrieved from: STN (CAS).

Cristina Buzea et al., Review of the Superconducting Properties of $MgB_2$, Superconductor Science and Technology, Nov. 30, 2001, vol. 14, No. 11, pp. R115-R-146.

Jun Nagamatsu et al., Superconductivity at 39K in magnesium diboride, Nature, Mar. 1, 2001, vol. 410, pp. 63-64.

* cited by examiner

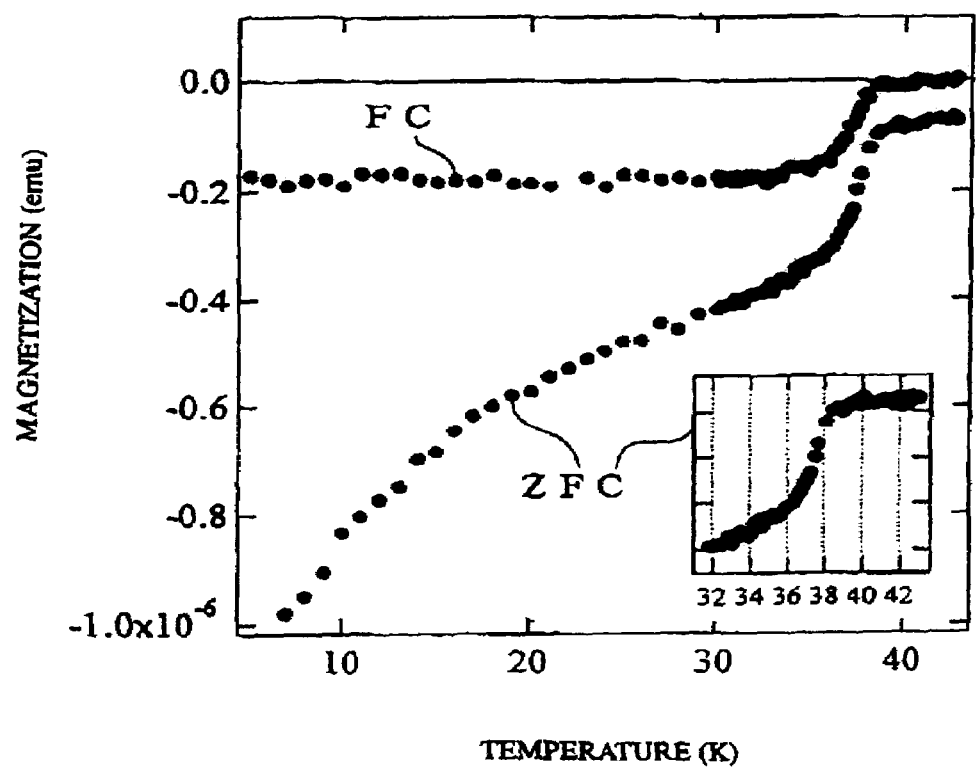

MGB2 SUPERCONDUCTOR AND METHOD FOR PREPARATION THEREOF

TECHNICAL FIELD

The present invention relates to a manufacturing method of an $MgB_2$ superconductor. More specifically, the present invention relates to a method which easily manufactures superconductive $MgB_2$ in various forms and at low costs without any special device.

BACKGROUND ART

With respect to superconductors having a high superconductive critical temperature (Tc), oxide superconductive substances have been known. However, it is difficult to process the oxide superconductive substances into a wire that is most widely applicable. For this reason, metal superconductive substances typically represented by A 15-type, etc. have been widely used since these substances are easily manufactured and worked although Tc is lower than those of the oxide superconductive substances.

Recently, it has been found by Akimitsu et al. that magnesium diboride ($MgB_2$), which is an intermetallic compound, exhibits a superconductive property at Tc=39 K. In comparison with the fact that Tc of A15-type metal superconductive substances is approximately 15 K and that Tc of niobium 3 germanium that has a comparatively high Tc is approximately 23 K, Tc of a metal superconductive substance is greatly increased by the discovery of the superconductive $MgB_2$. Thus, the application of the superconductive $MgB_2$ is expected as a superconductive material that takes the place of A15-type metal superconductive substances.

However, synthesis of superconductive $MgB_2$ is at a stage of detecting. For example, in the case where $MgB_2$ is prepared as a bulk material of a single phase, a high pressure of several GPa's is required due to an extreme difference in vapor pressures of Mg and B. Moreover, with respect to a manufacturing method of a $MgB_2$ wire, a method in which boron (B) formed into a wire shape reacts with Mg vapor at 950° C. has been known. Since these methods require high pressures or high temperatures, special devices have been used, failing to provide a sufficient method from the view point of convenience and costs.

The present invention has been made in light of the above-mentioned circumstances and has an object to provide a method of easily manufacturing superconductive $MgB_2$ in various forms, such as a wire or thin film, and at low costs without any special devices

DISCLOSURE OF INVENTION

The broad aspect of the present invention is to provide a manufacturing method of $MgB_2$ superconductor in which an electrode is steeped in a solution of Mg and B and a negative voltage is applied to the electrode so as to precipitate superconductive $MgB_2$ on the electrode.

Another aspect of the present invention is to provide a manufacturing method of $MgB_2$ superconductor in which the electrode is made of highly-doped silicon.

Another aspect of the present invention is to provide a manufacturing method of $MgB_2$ superconductor in which the electrode is made from a metal wire having a coil shape.

The other aspect of the present invention is to provide a superconductive material comprising an $MgB_2$ superconductor which is manufactured by either of the above-mentioned methods.

BRIEF DESCRIPTION OF DRAWINGS

FIG. 1 is a magnetization-temperature curve of a platinum wire sample coated with $MgB_2$ that is formed in an example.

BEST MODE FOR CARRYING OUT THE INVENTION

In the present invention, an electrode is steeped in a solution of Mg and B and a negative voltage is applied to the electrode so as to precipitate superconductive $MgB_2$ on the electrode. With respect to the solution, any acidic solution containing Mg and B, such as a nitric acid solution, a hydrochloric acid solution, a sulfuric acid solution, a carbonic acid solution and a boric acid solution, may be used. The ratio of Mg and B in the solution may be any ratio as long as it does not harm the superconductive property of $MgB_2$ for example, approximately 1:2 that is near the stoichiometric ratio of Mg:B. With respect to the concentration of $MgB_2$ in the solution, approximately 0.25 to 0.6 mol/l is preferable, 0.5 to 0.6 mol/l more preferable. In the solution, magnetic elements such as Mn, Fe, Co and Ni may be added so as to improve a superconductive property and other properties. With respect to an electrode, various electrodes including metal electrodes and nonmetal electrodes that conduct electricity may be used as long as they are chemically stable in the above-mentioned acidic solutions. More specifically, an electrode made of Fe, Co, Ni, Cu, Pd, Ag, Pt, Au and the like is exemplified as a metal electrode. As a nonmetal electrode, graphite, highly-doped silicon, a tin oxide and the like are exemplified.

In the present invention, superconductive $MgB_2$ as a precipitate on an electrode can be obtained by using an electric precipitation method in which an electrode is steeped in the above-mentioned solution and a negative voltage is applied to the electrode.

As described above, the present invention makes it possible to prepare $MgB_2$ with a simple construction. By optimizing conditions such as a solution density and an applied voltage, it is possible to cause $MgB_2$ to grow on the electrode with an even thickness. The method of the present invention eliminates high-precision and expensive devices that are used in vacuum vapor deposition. An $MgB_2$ superconductor is manufactured by using such a simple device as to be used in a plating process and the like. Therefore, it becomes possible to easily manufacture an $MgB_2$ superconductor at low costs. In accordance with the method of the present invention, it is also possible to form an $MgB_2$ film on a rear face of the substrate, which cannot be achieved by using vapor deposition method.

In addition, since the electrode is not limited to a flat-plate or rod-shaped electrode and a substrate having an arbitrary shape may be used for the electrode, it is possible that superconductive wire or coil is manufactured by evenly precipitating $MgB_2$ on a substrate formed into a desired shape such as a wire shape and a coil shape. In other words, it is possible to manufacture $MgB_2$ superconductive magnets. Moreover, by evenly precipitating $MgB_2$ on a highly-doped silicon having a low resistance of not more than 1 $\Omega$cm at normal temperature, a substrate, an element and the like which have a low resistance property in a wide temperature range are realized. Precipitation of $MgB_2$ on a plane substrate makes it possible to manufacture Josephson elements, superconductive quantum interference devices (SQUID), etc.

When $MgB_2$ having high Tc that is manufactured by the method of the present invention is applied to superconductive magnets, superconductive magnets will be provided at low costs because liquid He is not used for a coolant of a refrigerator. This contributes to diffusion of CT scans currently used in the medical fields and economic effects are expected. In the same manner, mass-production at low costs of superconductive parts to be used in magnetic resonance imaging devices (MRI) is expected.

EXAMPLE 1.0 g of commercially-available $MgB_2$ powder was dissolved in a water solution of a commercially-available condensed nitric acid (40 ml) and a gel substance and several grains of insoluble fine solid impurities were filtered and removed to obtain a solution of a transparent brown color. This solution was put into a platinum crucible with a capacity of 50 ml and a platinum wire with a thickness of 1 mm was steeped in the solution in a manner so as not to contact the platinum crucible. A rated voltage of 4.0 V was applied to the platinum wire as a negative electrode and to the platinum crucible as a positive electrode. Irritating gas generated on a wall face of the crucible is discharged. The solution was gradually enriched through natural evaporation. Prom the time when the solution was enriched twice as much as the initial concentration after six hours, a black substance started to be precipitated on the platinum wire. This black substance grew around the platinum wire with an even thickness in a film state.

A portion of the platinum wire on which $MgB_2$ had grown was cut to form a sample and magnetization property of the sample was measured by a SQUID fluxmeter under a magnetic field of 20 Gauss. FIG. 1 shows a magnetization-temperature curve of the platinum wire sample. Data in the FIG. 1, which were obtained by excluding normal magnetic component of the platinum wire itself, were indicated by ZFC when cooled in a non-magnet-field state and also indicated by FC when cooled in a magnetic field. An inset is an enlarged view in the vicinity of Tc of the ZFC curve. It was clearly shown that the wire sample clearly exhibited Meissner diamagnetism in the vicinity of 39 K that was a superconductivity transition temperature of $MgB_2$.

The present invention is not limited to the example described. Details are understood by those skilled in the art.

INDUSTRIAL ABILITY

Superconductive $MgB_2$ in various forms is easily manufactured at low cost without any special device.

The invention claim is:

1. A method of manufacturing $MgB_2$ superconductor, which comprises steeping an electrode in a solution of Mg and B, wherein a ratio of Mg:B is approximately 1:2, and applying a negative voltage to the electrode so as to precipitate superconductive $MgB_2$ on the electrode.

2. The method according to claim 1, wherein the electrode is made of highly-doped silicon.

3. The method according to claim 1, wherein the electrode is made from a metal wire having a coil shape.

* * * * *